(12) United States Patent
Kuwahara

(10) Patent No.: US 8,154,871 B2
(45) Date of Patent: Apr. 10, 2012

(54) COOLING STRUCTURE OF ELECTRONIC DEVICE

(75) Inventor: Shinichi Kuwahara, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 12/843,965

(22) Filed: Jul. 27, 2010

(65) Prior Publication Data

US 2011/0199731 A1 Aug. 18, 2011

(30) Foreign Application Priority Data

Feb. 16, 2010 (JP) ................................. 2010-031823
Jun. 29, 2010 (JP) ................................. 2010-148125

(51) Int. Cl.
*H05K 7/20* (2006.01)

(52) U.S. Cl. ........ 361/697; 361/676; 361/694; 361/695; 361/707; 257/707; 257/722

(58) Field of Classification Search .......... 361/688–690, 361/692, 694, 695, 697, 699, 704, 707, 715
See application file for complete search history.

(56) References Cited

U.S. PATENT DOCUMENTS

| | | | |
|---|---|---|---|
| 5,495,889 A * | 3/1996 | Dubelloy ................. | 165/104.33 |
| 6,084,771 A * | 7/2000 | Ranchy et al. ............... | 361/699 |
| 6,536,516 B2 * | 3/2003 | Davies et al. ................. | 165/170 |
| 6,989,592 B2 * | 1/2006 | Chang et al. .................. | 257/707 |
| 7,898,810 B2 * | 3/2011 | Mason et al. ................. | 361/717 |
| 7,940,524 B2 * | 5/2011 | Rummel et al. ............... | 361/689 |
| 2006/0002087 A1 * | 1/2006 | Bezama et al. ............... | 361/699 |
| 2007/0076355 A1 * | 4/2007 | Oohama ....................... | 361/676 |
| 2007/0256810 A1 * | 11/2007 | Di Stefano et al. ............ | 165/46 |
| 2010/0027222 A1 * | 2/2010 | Abert ............................ | 361/715 |

* cited by examiner

*Primary Examiner* — Courtney Smith
(74) *Attorney, Agent, or Firm* — Finnegan, Henderson, Farabow, Garrett & Dunner, L.L.P.

(57) ABSTRACT

According to one embodiment, a cooling structure includes a first heat radiating member receiving heat generated by a first heat generating body, and including a plurality of first heat radiating fins projecting toward a second housing, a first flow-in portion provided to the first housing to be open in one of first directions, a second heat radiating member receiving heat generated by a second heat generating body, and including a plurality of second heat radiating fins projecting toward a first housing, and a first flow-out portion provided to the second housing to be open in one of second directions crossing the first directions. The cooling structure includes a cooling fan unit configured to supply the air that has flown from outside to the first heat radiating fins, thereafter supply the air to the second heat radiating fins and cause the air to flow to the outside.

5 Claims, 6 Drawing Sheets

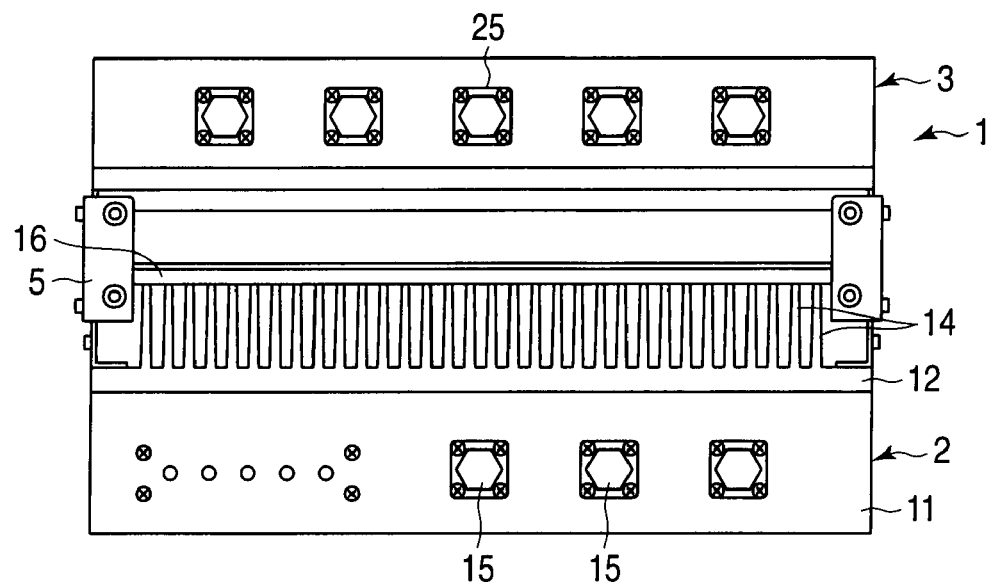
F I G. 1
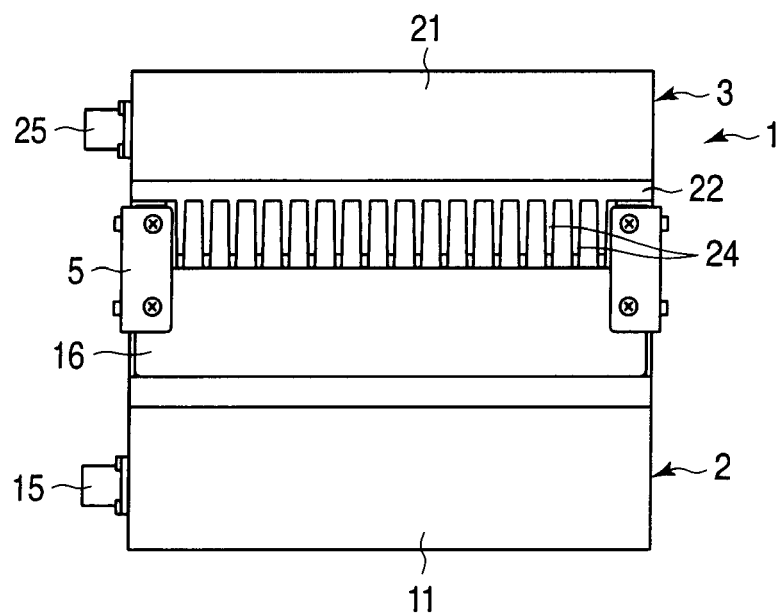
F I G. 2

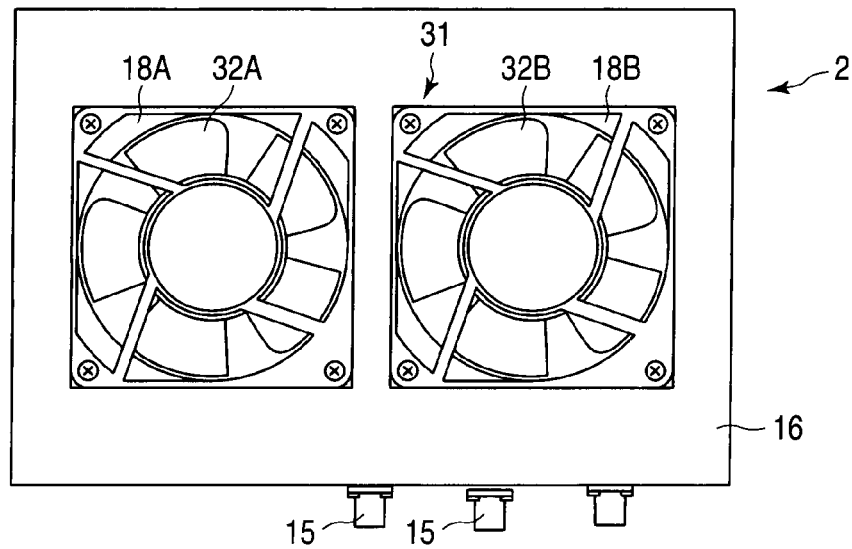
F I G. 5
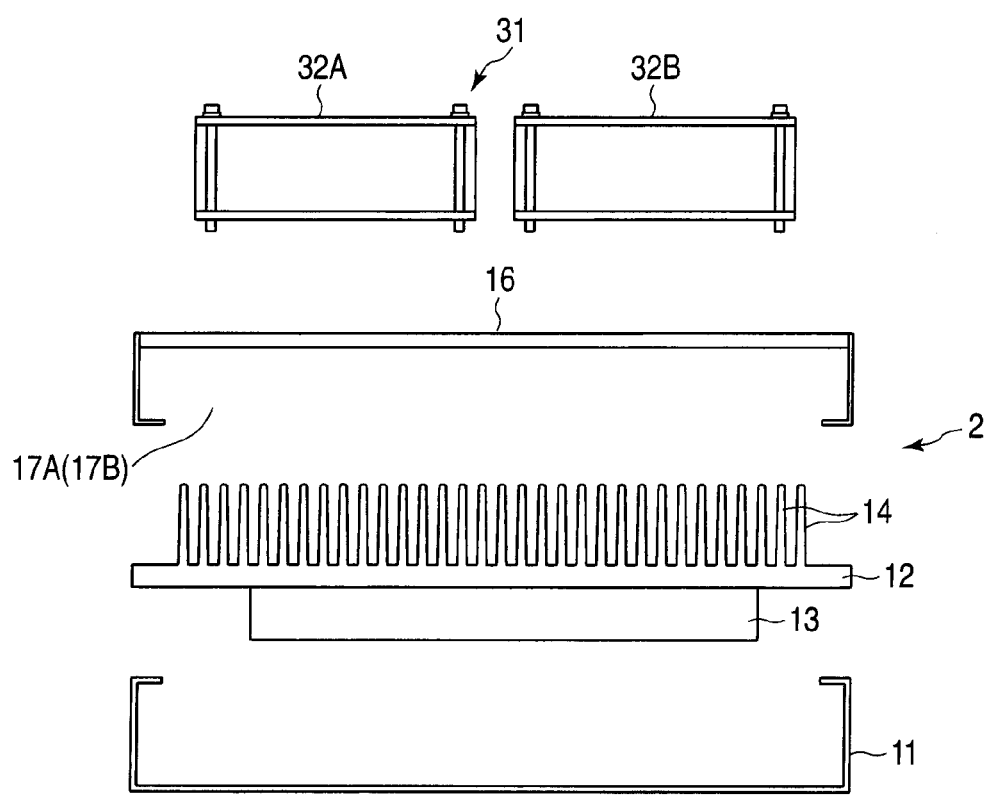
F I G. 6

COOLING STRUCTURE OF ELECTRONIC DEVICE

CROSS-REFERENCE TO RELATED APPLICATIONS

This application is based upon and claims the benefit of priority from Japanese Patent Applications No. 2010-031823, filed Feb. 16, 2010; and No. 2010-148125, filed Jun. 29, 2010; the entire contents of both of which are incorporated herein by reference.

FIELD

Embodiments described herein relate generally to a cooling structure of an electronic device.

BACKGROUND

An electronic device for using in an electronic device system, such as a communication system, includes a variety of electronic parts which generate heat in a device housing. The heat generated in the electronic parts reduces performance of the electronic parts. To avoid the reduction of performance, the electronic device includes a cooling structure to control the heat generated in the electronic parts. Further, there is a demand for reduction in size of the electronic device and increase in capacity of the electronic parts. Therefore, a cooling structure which satisfies this demand is adopted to the electronic device.

For example, an electronic device includes a device housing, an electronic part provided inside the device housing, and a heat radiating member which transmits heat generated by the electronic part to the device housing. This type of electronic device adopts a cooling structure of a forced air cooling system, in which an outer wall portion of the device housing is cooled by a cooling fan.

BRIEF DESCRIPTION OF THE DRAWINGS

FIG. 1 is a plan view showing an electronic device according to a first embodiment of the present invention as viewed in a first direction.

FIG. 2 is a plan view showing the electronic device according to the first embodiment as viewed in a second direction.

FIG. 5 is a plan view showing the first housing according to the first embodiment as viewed from above.

FIG. 6 is a plan view showing an exploded state of the first housing according to the first embodiment as viewed in the first direction.

DETAILED DESCRIPTION

In general, according to one embodiment, a cooling structure of an electronic device, the structure includes a first housing; a second housing stacked on the first housing; a first heat generating body disposed inside the first housing; a first heat radiating member which is attached to a side of the first heat generating body facing to the second housing in stacking directions of the first housing and the second housing, and which receives heat generated by the first heat generating body, the first heat radiating member including a plurality of first heat radiating fins projecting toward the second housing in the stacking directions; a first flow-in portion which is provided to the first housing to be open in one of first directions perpendicular to the stacking directions, and which causes air to flow into the first housing from outside; a second heat generating body disposed inside the second housing; a second heat radiating member which is attached to a side of the second heat generating body facing to the first housing in the stacking directions, and which receives heat generated by the second heat generating body, the second heat radiating member including a plurality of second heat radiating fins projecting toward the first housing in the stacking directions; a first flow-out portion which is provided to the second housing to be open in one of second directions perpendicular to the stacking directions and crossing the first directions, and which causes air to flow out of the second housing to the outside; and a cooling fan unit interposed between the first heat radiating fins and the second heat radiating fins in the stacking directions, the cooling fan unit being configured to supply the air that has flown in the first housing to the first heat radiating fins, thereafter supply the air to the second heat radiating fins in the second housing via the cooling fan unit and cause the air to flow out of the second housing.

First Embodiment

Figure 3:
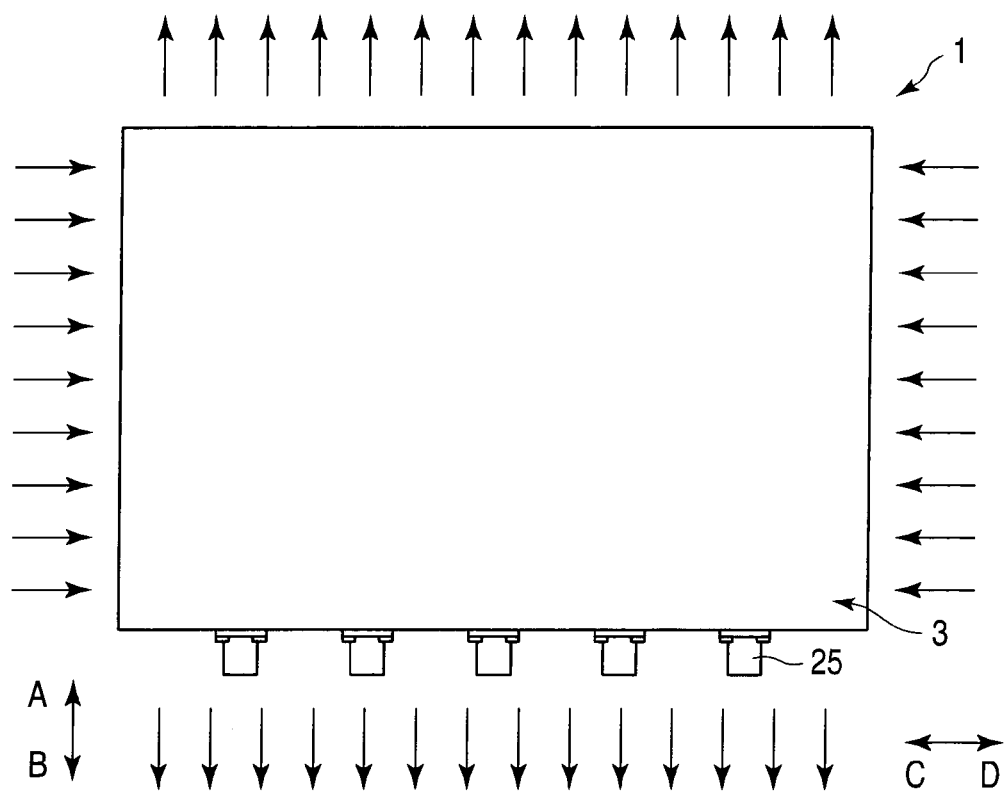
FIG. 3 is a plan view showing the electronic device according to the first embodiment as viewed from above.

A first embodiment of the present invention will be described with reference to FIG. 1 to FIG. 10. FIG. 1 to FIG. 3 show a cooling structure of an electronic device 1 of this embodiment. As shown in FIG. 1 and FIG. 2, the electronic device 1 includes a first housing 2, and a second housing 3 which is stacked on an upper side of the first housing 2. The first housing 2 and the second housing 3 are positioned with each other and fixed by a fixing element 5. In other words, the fixing element 5 is a fixing member which fixes the first housing 2 and the second housing 3 in a positioned state.

In this description, directions perpendicular to stacking directions in which the first housing 2 and the second housing 3 are stacked (up-and-down directions in FIG. 1 and FIG. 2) are defined as first directions (directions of arrows A and B in FIG. 3). Directions perpendicular to the stacking directions and crossing the first directions (in this embodiment, perpendicular to the first directions) are defined as second directions (directions of arrows C and D in FIG. 3). FIG. 1 shows the electronic device 1 as viewed from one of the first directions. FIG. 2 shows the electronic device 1 as viewed from one of the second directions. FIG. 3 shows the electronic device 1 as viewed from above (one of the stacking directions).

Figure 4:
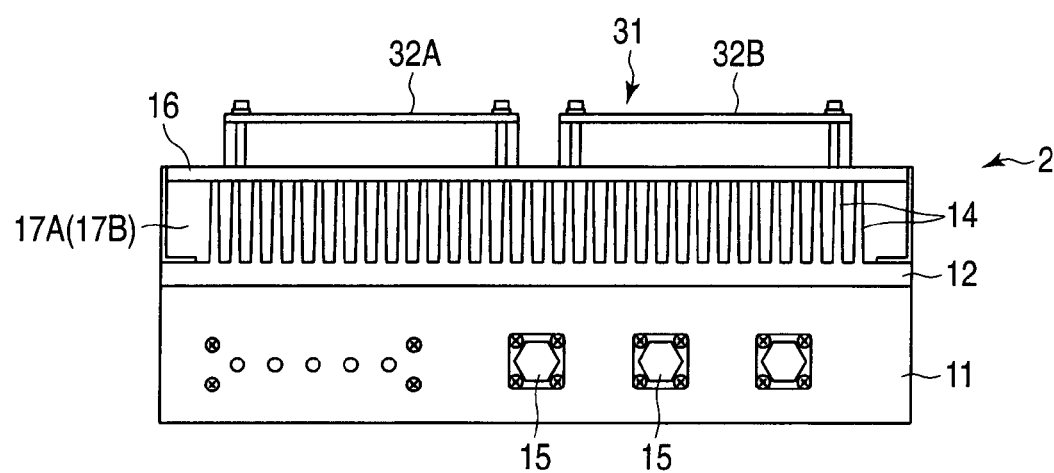
FIG. 4 is a plan view showing a first housing according to the first embodiment as viewed in the first direction.

FIG. 4 to FIG. 6 show a configuration of the first housing 2. FIG. 4 and FIG. 6 show the first housing 2 as viewed from one of the first directions. FIG. 5 shows the first housing 2 as viewed from above (one of the stacking directions).

As shown in FIG. 4 and FIG. 6, the first housing 2 includes a bottomed cylindrical body 11. A first heat radiating member 12 is attached to an upper side of the bottomed cylindrical body 11 (a side that faces to the second housing 3 in the stacking directions). Inside the first housing 2, a first heat generating body 13 is disposed. The first heat generating body 13 is an electronic part, such as a power supply. The first heat generating body 13 is attached to a lower surface of the first heat radiating member 12. In other words, the first heat radiating member 12 is attached to the first heat generating body 13 on a side that faces to the second housing 3 in the stacking directions. Heat generated by the first heat generating body 13 is transferred to the first heat radiating member 12. The first heat radiating member 12 includes a plurality of first heat radiating fins 14, which are projecting upward (toward the second housing 3 in the stacking directions). The first heat radiating fins 14 extend in the first directions and spaced apart from one another. In other words, the first heat radiating fins 14 are first plate-like fins which extend in the first directions and spaced apart from one another. Further, an external connecting portion 15 is provided on one side surface of the bottomed cylindrical body 11 in the first directions. The external connecting portion 15 is connected to the first heat generating body 13 by a wire (not shown).

A cover member 16 is attached to an upper side of the first heat radiating member 12 (a side that faces to the second housing 3 in the stacking directions). The cover member 16 includes a first flow-out portion 17A which opens in one of the first directions and a second flow-out portion 17B which opens in the other of the first directions. Thus, the first flow-out portion 17A is provided to the first housing 2 so as to open in one of the first directions, and the second flow-out portion 17B is provided to the first housing 2 so as to open in the other of the first directions. Because of the first flow-out portion 17A and the second flow-out portion 17B, the area where the first heat radiating fins 14 are located inside the first housing 2 is open to the outside of the electronic device 1.

As shown in FIGS. 5 and 6, two hole portions 18A and 18B are provided to an upper wall of the cover member 16. A cooling fan unit 31 is attached to the cover member 16 such that it is inserted in the hole portions 18A and 18B. The cooling fan unit 31 includes a cooling fan 32A inserted in the hole portion 18A and a cooling fan 32B inserted in the hole portion 18B. Each of the cooling fans 32A and 32B is disposed such that the flow-out side is directed downward (toward the first heat radiating member 12). Because of this configuration, air is supplied to the first heat radiating fins 14 through the cooling fans 32A and 32B of the cooling fan unit 31. The air supplied to the first heat radiating fins 14 is moved in the first directions along the first heat radiating fins 14 among the first heat radiating fins 14 and flows out of the electronic device 1 through the first flow-out portion 17A or the second flow-out portion 17B.

Figure 7:
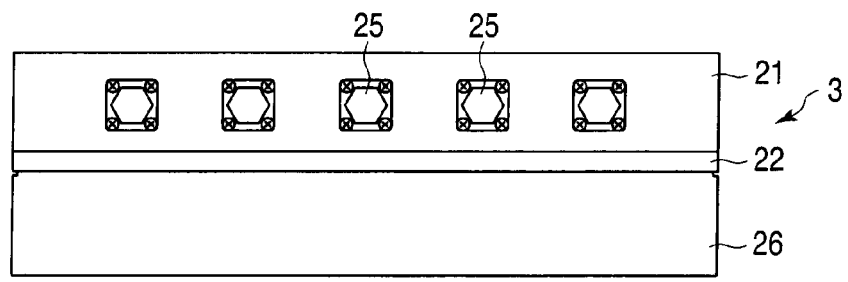
FIG. 7 is a plan view showing a second housing according to the first embodiment as viewed in the first direction.
Figure 8:
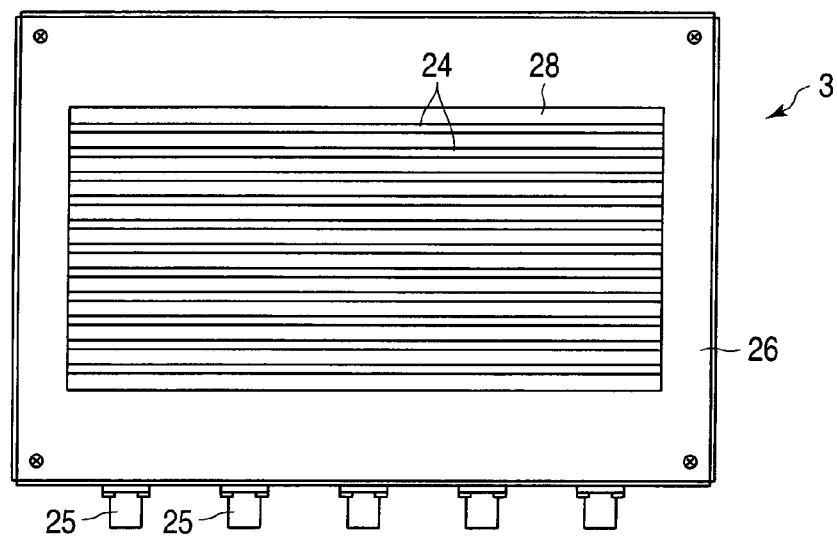
FIG. 8 is a plan view showing the second housing according to the first embodiment as viewed from below.
Figure 9:
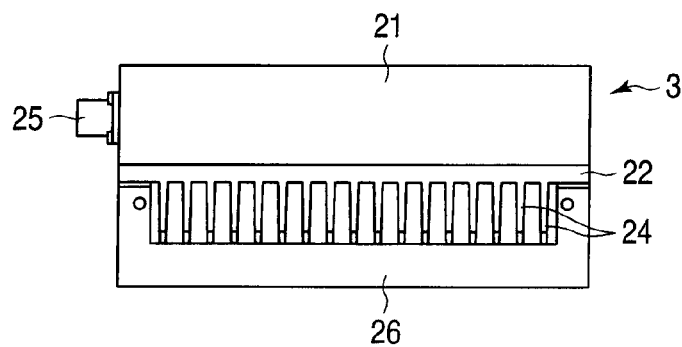
FIG. 9 is a plan view showing the second housing according to the first embodiment as viewed in the second direction.
Figure 10:
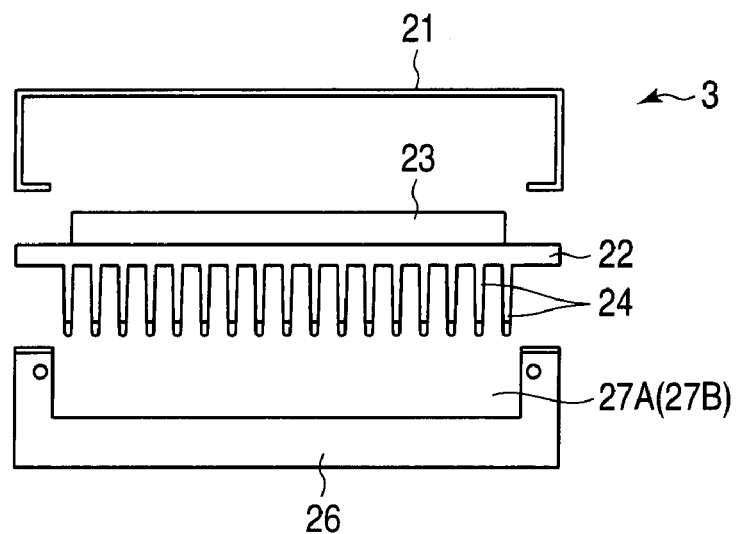
FIG. 10 is a plan view showing an exploded state of the second housing according to the first embodiment as viewed in the second direction.

FIG. 7 to FIG. 10 show a configuration of the second housing 3. FIG. 7 shows the second housing 3 as viewed from one of the first directions. FIG. 8 shows the second housing 3 as viewed from below (the other of the stacking directions). FIGS. 9 and 10 show the second housing 3 as viewed in one of the second directions.

As shown in FIG. 9 and FIG. 10, the second housing 3 includes a topped cylindrical body 21. A second heat radiating member 22 is attached to a lower side of the topped cylindrical body 21 (a side that faces to the first housing 2 in the stacking directions). Inside the second housing 3, a second heat generating body 23 is disposed. The second heat generating body 23 is an electronic part, such as an amplifier. The second heat generating body 23 is attached to an upper surface of the second heat radiating member 22. In other words, the second heat radiating member 22 is attached to the second heat generating body 23 on a side that faces to the first housing 2 in the stacking directions. Heat generated by the second heat generating body 23 is transferred to the second heat radiating member 22. The second heat radiating member 22 includes a plurality of second heat radiating fins 24, which are projecting downward (toward the first housing 2 in the stacking directions). The second heat radiating fins 24 extend in the second directions and spaced apart from one another. In other words, the second heat radiating fins 24 are second plate-like fins which extend in the second directions and spaced apart from one another. Further, an external connecting portion 25 is provided on one side surface of the topped cylindrical body 21 in the second directions. The external connecting portion 25 is connected to the second heat generating body 23 by a wire (not shown).

A cover member 26 is attached to a lower side of the second heat radiating member 22 (a side that faces to the first housing 2 in the stacking directions). The cover member 26 includes a first flow-in portion 27A which opens in one of the second directions and a second flow-in portion 27B which opens in the other of the second directions. Thus, the first flow-in portion 27A is provided to the second housing 3 so as to open in one of the second directions, and the second flow-in portion 27B is provided to the second housing 3 so as to open in the other of the second directions. Because of the first flow-in portion 27A and the second flow-in portion 27B, the area where the second heat radiating fins 24 are located inside the second housing 3 is open to the outside of the electronic device 1. Further, since the first flow-in portion 27A and the second flow-in portion 27B are open in the second directions, the directions of air flowing from the outside (the second directions) cross (in this embodiment, forms right angles with) the directions of air flowing to the outside (the first directions).

As shown in FIG. 8, a hole portion 28 is provided to a bottom wall of the cover member 26. The cooling fan unit 31 attached to the cover member 16 of the first housing 2 is inserted into the hole portion 28. Each of the cooling fans 32A and 32B of the cooling fan unit 31 is inserted into the hole portion 28 and disposed such that the flow-in side is directed upward (toward the second heat radiating member 22). Thus, the cooling fan unit 31 is interposed between the first heat radiating fins 14 and the second heat radiating fins 24. Because of this configuration, air that has flown in the second housing 3 through the first flow-in portion 27A or the second flow-in portion 27B is supplied to the second heat radiating fins 24. The air supplied to the second heat radiating fins 24 is moved in the second directions along the second heat radiating fins 24 among the second heat radiating fins 24 and supplied to the first heat radiating fins 14 through the cooling fans 32A and 32B of the cooling fan unit 31.

An operation of the cooling structure of the electronic device 1 will be described below. In the electronic device 1, the first housing 2 is set to a specified position and the second housing 3 is stacked on the upper side of the cover member 16 of the first housing 2. At this time, the cooling fan unit 31 has been attached to the cover member 16 of the first housing 2 such that it is inserted in the hole portions 18A and 18B. In the state where the second housing 3 is stacked on the first housing 2, the cooling fan unit 31 attached to the first housing 2 is inserted in the hole portion 28 of the cover member 26 of the second housing 3. The first housing 2 and the second housing 3 are positioned with each other and fixed by the fixing element 5. In this state, the cooling fans 32A and 32B are disposed such that the flow-in sides face to the second heat radiating member 22 and the flow-out sides face to the first heat radiating member 12. Thus, the hole portions 18A and 18B of the cover member 16 and the hole portion 28 of the cover member 26 form a cooling fan disposing portion where the cooling fan unit 31 is disposed.

The first heat generating body 13 is disposed in the first housing 2, and the second heat generating body 23 is disposed in the second housing 3. The heat generated in the first heat generating body 13 is transferred to the first heat radiating member 12. Similarly, the heat generated in the second heat generating body 23 is transferred to the second heat radiating member 22.

To radiate the heat, the cooling fans 32A and 32B are driven. Driving the cooling fans 32A and 32B causes the air outside the electronic device 1 to flow in the second housing 3 through the first flow-in portion 27A or the second flow-in portion 27B and to be supplied to the second heat radiating fins 24. The air supplied to the second heat radiating fins 24 is moved in the second directions along the second heat radiating fins 24 among the second heat radiating fins 24. As a result, the heat transferred to the second heat radiating member 22 is radiated through the second heat radiating fins 24. The air which receives the heat from the second heat radiating fins 24 is moved to the outside of the second housing 3 through the cooling fans 32A and 32B of the cooling fan unit 31. Thus, the heat generated in the second heat generating body 23 is radiated out of the second housing 3.

The air which has passed through the cooling fans 32A and 32B of the cooling fan unit 31 is moved in the first housing 2, and supplied to the first heat radiating fins 14. The air supplied to the first heat radiating fins 14 is moved in the first directions along the first heat radiating fins 14 among the first heat radiating fins 14. As a result, the heat transferred to the first heat radiating member 12 is radiated through the first heat radiating fins 14. The air which receives the heat from the first heat radiating fins 14 flows out of the electronic device 1 through the first flow-out portion 17A or the second flow-out portion 17B. Thus, the heat generated in the first heat generating body 13 is radiated out of the first housing 2.

The cooling structure of the electronic device 1 including the configuration described above produces the following effects. Specifically, in the electronic device 1, the first housing 2 containing the first heat generating body 13 therein and the second housing 3 containing the second heat generating body 23 therein are disposed in a stacked state. The heat generated in the first heat generating body 13 is transferred to the first heat radiating member 12, and the heat generated in the second heat generating body 23 is transferred to the second heat radiating member 22. Further, the cooling fan unit 31 is interposed between the first heat radiating member 12 and the second heat radiating member 22 with respect to the stacking directions. Driving the cooling fans 32A and 32B of the cooling fan unit 31 causes the air outside the electronic device 1 to flow in the second housing 3 through the first flow-in portion 27A or the second flow-in portion 27B and to be supplied to the second heat radiating fins 24 of the second heat radiating member 22. The air is supplied to the first heat radiating fins 14 of the first heat radiating member 12 through the cooling fans 32A and 32B of the cooling fan unit 31, and flows out of the electronic device 1 through the first flow-out portion 17A or the second flow-out portion 17B. Thus, both the first heat generating body 13 in the first housing 2 and the second heat generating body 23 in the second housing 3 are heat-controlled by the simple cooling structure. Furthermore, the heat control of the first heat generating body 13 and the second heat generating body 23 can be carried out with a minimum air-blowing capacity without increasing the air-blowing capacity of the cooling fan unit 31.

Moreover, in the cooling structure of the electronic device 1, external air flows in the second housing 3 in the second directions through the first flow-in portion 27A or the second flow-in portion 27B. The air inside the first housing 2 flows out in the first directions crossing the second directions through the first flow-out portion 17A or the second flow-out portion 17B. In sum, the air flows in the electronic device 1 in the second directions and flows out of the electronic device 1 in the first directions crossing the second directions. With this configuration, after the air which receives the heat transferred from the first heat radiating fins 14 and the second heat radiating fins 24 flows out of the electronic device 1, the heated air is prevented from flowing in the electronic device again. Thus, the heat generated by the first heat generating body 13 and the second heat generating body 23 can be radiated more efficiently.

Furthermore, in the electronic device 1, the first heat radiating fins 14 are first plate-like fins which extend in the first directions and spaced apart from one another. Similarly, the second heat radiating fins 24 are second plate-like fins which extend in the second directions and spaced apart from one another. With this configuration, the air supplied to the first heat radiating fins 14 is moved in the first directions along the first heat radiating fins 14 among the first heat radiating fins 14. Thus, the heat transferred to the first heat radiating member 12 is radiated from the first heat radiating fins 14. Similarly, the air supplied to the second heat radiating fins 24 is moved in the second directions along the second heat radiating fins 24 among the second heat radiating fins 24. Thus, the heat transferred to the second heat radiating member 22 is radiated from the second heat radiating fins 24. Accordingly, the heat generated by the first heat generating body 13 and the second heat generating body 23 can be radiated more efficiently.

In the cooling mechanism of the electronic device 1, the external air flows in the second housing 3 in both of the second directions. The air flows out of the first housing 2 in both of the first directions. Since impingement cooling is adopted to cause the air to flow in the opposite directions, the heat generated by the first heat generating body 13 and the second heat generating body 23 can be radiated more efficiently.

In the electronic device 1, the cooling fan unit 31 is attached to the cover member 16 such that it is inserted in the hole portions 18A and 18B. In the state where the first housing 2 and the second housing 3 are stacked, the cooling fan unit 31 attached to the first housing 2 is inserted in the hole portion 28. Thus, the hole portions 18A and 18B of the cover member 16 and the hole portion 28 of the cover member 26 form a cooling fan disposing portion where the cooling fan unit 31 is disposed. Since the cooling fan disposing portion is formed of the first housing 2 and the second housing 3, the size of the electronic device in the stacking directions is reduced as compared to the conventional device. Thus, downsizing of the electronic device 1 is realized.

The electronic device 1 can be divided into a unit including the first housing 2 and the cooling fan unit 31 and a unit including the second housing 3. Since the units can be conveyed or assembled individually, the workability of manufacturing the electronic device 1 is improved.

Modifications of the First Embodiment

Figure 11:
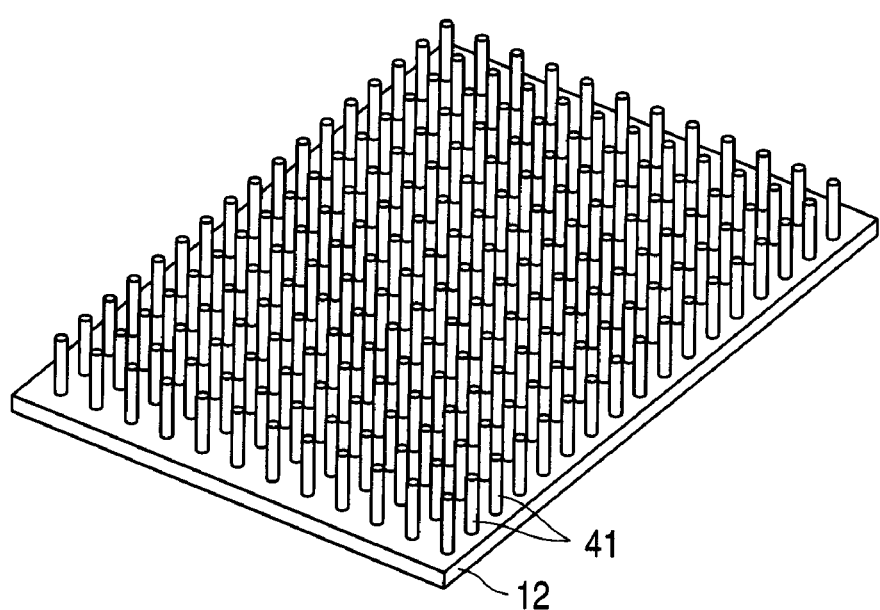
FIG. 11 is a perspective view showing an internal configuration of the first housing according to a modification of the first embodiment.

In the first embodiment, the first heat radiating fins 14 are first plate-like fins which extend in the first directions and spaced apart from one another, and the second heat radiating fins 24 are second plate-like fins which extend in the second directions and spaced apart from one another. However, in other embodiments, the first heat radiating fins 14 and the second heat radiating fins 24 are not limited to the above-mentioned configuration. The first heat radiating member 12 may include a plurality of first heat radiating fins 14, which project toward the second housing 3 in the stacking directions. Similarly, the second heat radiating member 22 may include a plurality of second heat radiating fins 24, which project toward the first housing 2 in the stacking directions. For example, in one embodiment, as shown in FIG. 11, the first heat radiating member 12 may include a plurality of pin-shaped heat radiating fins 41 projecting toward the second housing 3 in the stacking directions.

Further, in the first embodiment, the second housing 3 includes the first flow-in portion 27A and the second flow-in portion 27B, and the first housing 2 includes the first flow-out portion 17A and the second flow-out portion 17B. However, in other embodiments the first housing 2 may include flow-in portions and the second housing 3 may include flow-out portions.

The cooling structure of the first embodiment includes the two flow-in portions, i.e., the first flow-in portion 27A and the second flow-in portion 27B, and the two flow-out portions, i.e., the first flow-out portion 17A and the second flow-out portion 17B. However, in other embodiments, the cooling structure may include one flow-in portion and one flow-out portion. For example, in one embodiment, the first housing 2 may include a flow-out portion which is open in one of the first directions perpendicular to the stacking directions, and the second housing 3 may include a flow-in portion which is open in one of the second directions perpendicular to the stacking directions and crossing the first directions.

In the first embodiment, the cooling fan unit 31 includes two cooling fans 32A and 32B. However, in other embodiments, the cooling fan unit 31 including one cooling fan may be used.

Further, in the first embodiment, the hole portions 18A and 18B of the cover member 16 and the hole portion 28 of the cover member 26 form the cooling fan disposing portion where the cooling fan unit 31 is disposed. However, in other embodiments, the cooling fan disposing portion where the cooling fan unit 31 is disposed may be formed of at least one of the first housing 2 and the second housing 3. For example, in one embodiment, the hole portions 18A and 18B of the cover member 16 of the first housing 2 form the cooling fan disposing portion. In this case, the cover member 26 of the second housing 3 does not have a bottom wall.

Second Embodiment

A second embodiment of the present invention will now be described with reference to FIG. 12 and FIG. 13. The same parts and parts which have the same functions as those of the first embodiment are identified by the same reference symbols as those used for the first embodiment, and descriptions thereof are omitted.

Figure 12:
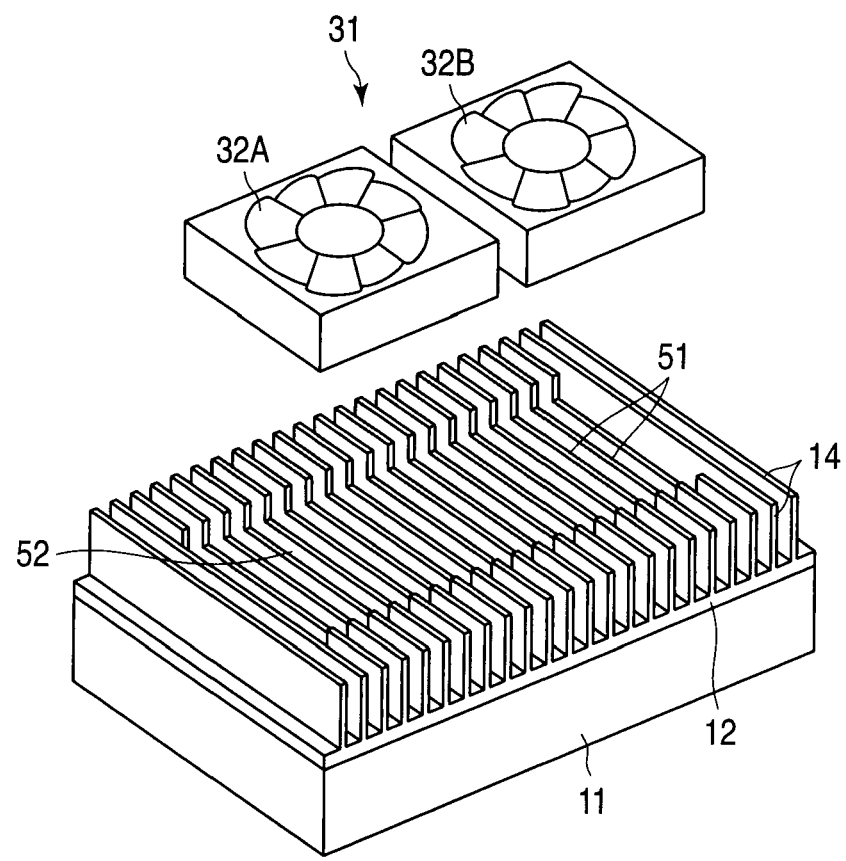
FIG. 12 is a perspective view showing an internal configuration of the first housing according to a second embodiment of the present invention.
Figure 13:
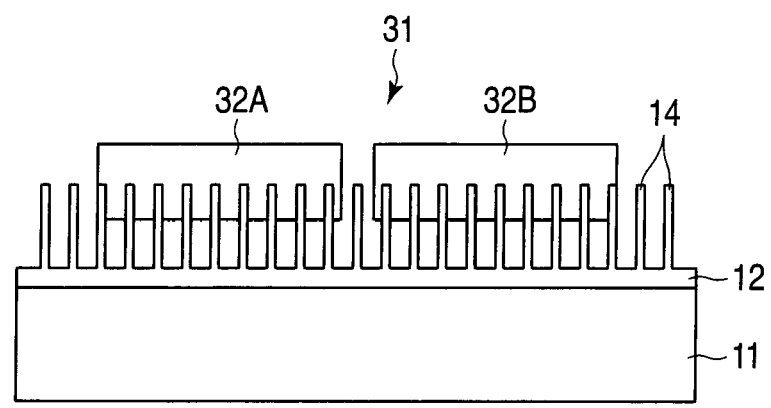
FIG. 13 is a plan view showing an internal configuration of the first housing according to the second embodiment.

FIG. 12 and FIG. 13 are diagrams showing an internal configuration of the first housing 2 of the second embodiment. FIG. 13 is a diagram of the first housing 2 as viewed in one of the first directions. As shown in FIG. 12 and FIG. 13, in the first housing 2, the first heat radiating member 12 is attached to the upper side of the bottomed cylindrical body 11 (the side that faces to the second housing 3 in the stacking directions). The first heat radiating member 12 includes a plurality of first heat radiating fins 14, which are projecting upward (toward the second housing 3 in the stacking directions). The first heat radiating fins 14 are first plate-like fins which extend in the first directions and spaced apart from one another.

The first heat radiating fins 14 include shorter projecting fins 51, which are shorter than the other first heat radiating fins 14. Since the first heat radiating fins include the shorter projecting fins 51, space 52 is formed above the shorter projecting fins 51. A cooling fan unit 31 is inserted in the space 52. In other words, the shorter projecting fins 51 form the space 52 in which the cooling fan unit 31 is inserted.

The cooling structure of the electronic device 1 including the configuration described above produces the following effects in addition to the effects of the first embodiment. In the electronic device 1, the first heat radiating fins 14 include shorter projecting fins 51, which are shorter than the other first heat radiating fins 14. The cooling fan unit 31 is inserted in the space 52, which is formed above the shorter projecting fins 51. With this configuration, for example, the cover member 26 of the second housing 3 (refer to the first embodiment) can be omitted. Thus, the dimensions of the first housing and the second housing in the stacking directions can be smaller than in the first embodiment. Accordingly, the electronic device 1 can be more compact.

Modifications of the Second Embodiment

In the second embodiment, the first heat radiating fins 14 include the shorter projecting fins 51, which are shorter than the other first heat radiating fins 14. However, in other embodiments, at least one of the first heat radiating fins 14 and the second heat radiating fins 24 may include shorter projecting fins 51, which are shorter than the other heat radiating fins. For example, in one embodiment, the second heat radiating fins 24 include shorter projecting fins 51, which are shorter than the other second heat radiating fins 24. In this case, space 52, in which the cooling fan unit 31 is inserted, is formed under the shorter projecting fins 51.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cooling structure of an electronic device, the structure comprising:
   a first housing;
   a second housing stacked on the first housing;
   a first heat generating body disposed inside the first housing;
   a first heat radiating member which is attached to a side of the first heat generating body facing to the second housing in stacking directions of the first housing and the second housing, and which receives heat generated by the first heat generating body, the first heat radiating member including a plurality of first heat radiating fins projecting toward the second housing in the stacking directions;

a first flow-in portion which is provided to the first housing to be open in one of first directions perpendicular to the stacking directions, and which causes air to flow into the first housing from outside;

a second heat generating body disposed inside the second housing;

a second heat radiating member which is attached to a side of the second heat generating body facing to the first housing in the stacking directions, and which receives heat generated by the second heat generating body, the second heat radiating member including a plurality of second heat radiating fins projecting toward the first housing in the stacking directions;

a first flow-out portion which is provided to the second housing to be open in one of second directions perpendicular to the stacking directions and crossing the first directions, and which causes air to flow out of the second housing to the outside; and a cooling fan unit interposed between the first heat radiating fins and the second heat radiating fins in the stacking directions, the cooling fan unit being configured to supply the air that has flown in the first housing to the first heat radiating fins, thereafter supply the air to the second heat radiating fins in the second housing via the cooling fan unit and cause the air to flow out of the second housing.

2. The cooling structure according to claim 1, wherein:
the first heat radiating fins include first plate-like fins which extend in the first directions and spaced apart from one another; and
the second heat radiating fins include second plate-like fins which extend in the second directions and spaced apart from one another.

3. The cooling structure according to claim 1, wherein at least one of the first heat radiating fins and the second heat radiating fins include a shorter projecting fin being shorter than the other heat radiating fins, and forming a space in which the cooling fan unit is inserted.

4. The cooling structure according to claim 1, further comprising:
a second flow-in portion which is provided to the first housing to be open in the other of the first directions, and which causes the air to flow into the first housing and to be supplied to the first heat radiating fins by the cooling fan unit; and
a second flow-out portion which is provided to the second housing to be open in the other of the second directions, and which causes the air supplied to the second heat radiating fins by the cooling fan unit and to flow out of the second housing to the outside.

5. The cooling structure according to claim 1, further comprising a fixing element which fixes the first housing and the second housing in a positioned state.

* * * * *